United States Patent
Wang et al.

(10) Patent No.: US 11,404,510 B2
(45) Date of Patent: Aug. 2, 2022

(54) STRETCHABLE DISPLAY PANEL, STRETCHABLE DISPLAY APPARATUS, AND METHOD OF FABRICATING STRETCHABLE DISPLAY PANEL

(71) Applicant: BOE Technology Group Co., Ltd., Beijing (CN)

(72) Inventors: Pinfan Wang, Beijing (CN); Lei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 290 days.

(21) Appl. No.: 16/496,648

(22) PCT Filed: Nov. 9, 2018

(86) PCT No.: PCT/CN2018/114756
§ 371 (c)(1),
(2) Date: Sep. 23, 2019

(87) PCT Pub. No.: WO2020/093354
PCT Pub. Date: May 14, 2020

(65) Prior Publication Data
US 2021/0335951 A1 Oct. 28, 2021

(51) Int. Cl.
*G09G 3/00* (2006.01)
*H01L 27/32* (2006.01)
(Continued)

(52) U.S. Cl.
CPC ......... *H01L 27/3262* (2013.01); *G09G 3/035* (2020.08); *G09G 3/32* (2013.01);
(Continued)

(58) Field of Classification Search
CPC ...... G09G 3/32; G09G 3/035; G09G 2380/02; H01L 51/0097; H01L 2251/5338
See application file for complete search history.

(56) References Cited

U.S. PATENT DOCUMENTS 9,756,723 B2    9/2017 Hong et al.
2016/0028043 A1   1/2016 Kwon et al.
(Continued)

FOREIGN PATENT DOCUMENTS

CN    106057855 A     10/2016
CN    106898635 A  *  6/2017   ............. H01L 27/32
(Continued)

OTHER PUBLICATIONS

International Search Report & Written Opinion dated Jul. 30, 2019, regarding PCT/CN2018/114756.
Da Yin et al., Efficient and Mechanically Robust Stretchable Organic Light-emitting Devices by a Laser-programmable Buckling Process, Nature Communications, Published May 17, 2016, DOI:10.1038/ncomms11573.

*Primary Examiner* — Yuzhen Shen
(74) *Attorney, Agent, or Firm* — Intellectual Valley Law, P.C.

(57) ABSTRACT

A stretchable display panel has a plurality of first regions and a plurality of second regions alternately arranged. The stretchable display panel includes a plurality of first light emitting elements and a plurality of first driving circuits for driving light emission of the plurality of first light emitting elements; and a plurality of second light emitting elements and a plurality of second driving circuits for driving light emission of the plurality of second light emitting elements. The plurality of first light emitting elements, the plurality of first driving circuits, and the plurality of second driving circuits are limited in the plurality of first regions. The plurality of second light emitting elements are limited is the plurality of second regions. The stretchable display panel in the plurality of first regions have a Young's modulus greater than a Young's modulus in the plurality of second regions of the stretchable display panel.

20 Claims, 10 Drawing Sheets

(51) Int. Cl.
*G09G 3/32* (2016.01)
*H01L 25/10* (2006.01)
*H01L 25/16* (2006.01)
*H01L 25/00* (2006.01)
*H01L 51/56* (2006.01)
*H01L 27/12* (2006.01)
*H01L 51/00* (2006.01)

(52) U.S. Cl.
CPC .......... *H01L 25/105* (2013.01); *H01L 25/167* (2013.01); *H01L 25/50* (2013.01); *H01L 27/3248* (2013.01); *H01L 27/3258* (2013.01); *H01L 51/56* (2013.01); *G09G 2300/0809* (2013.01); *H01L 27/1214* (2013.01); *H01L 51/0097* (2013.01); *H01L 2227/323* (2013.01); *H01L 2251/5338* (2013.01)

(56) References Cited

U.S. PATENT DOCUMENTS

| | | |
|---|---|---|
| 2016/0226024 A1* | 8/2016 | Park .................. H01L 51/5253 |
| 2017/0249886 A1 | 8/2017 | Choi |
| 2017/0345365 A1 | 11/2017 | Li |
| 2020/0193899 A1* | 6/2020 | Li .......................... G09F 9/33 |
| 2020/0203608 A1* | 6/2020 | Jang .................. H01L 27/1218 |

FOREIGN PATENT DOCUMENTS

| | | |
|---|---|---|
| CN | 106898635 A | 6/2017 |
| CN | 108227281 A | 6/2018 |
| CN | 108492762 A | 9/2018 |
| CN | 108550587 A | 9/2018 |

\* cited by examiner

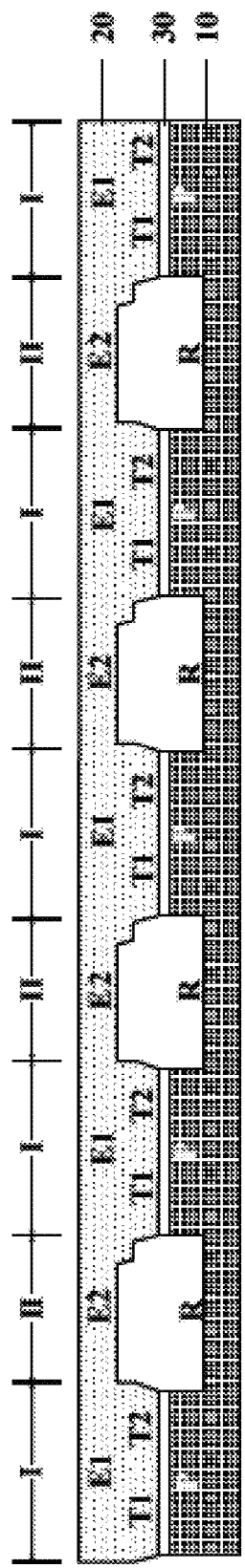

STRETCHABLE DISPLAY PANEL, STRETCHABLE DISPLAY APPARATUS, AND METHOD OF FABRICATING STRETCHABLE DISPLAY PANEL

CROSS-REFERENCE TO RELATED APPLICATION

This application is a national stage application under 35 U.S.C. § 371 of International Application No. PCT/CN2018/114756, filed Nov. 9, 2018, the contents of which are incorporated by reference in the entirety.

TECHNICAL FIELD

The present invention relates to display technology, more particularly, to a stretchable display panel, a stretchable display apparatus, and a method of fabricating a stretchable display panel.

BACKGROUND

Flexible electronic apparatuses and stretchable electronic apparatuses have been developed in recent years. Flexible electronic apparatuses are apparatuses that may be bent or folded, typically fabricated by mounting an electronic device on a flexible base substrate. Stretchable electronic apparatuses are apparatuses that allows its length to be increased in one or more dimensions. Stretchable electronic apparatuses may be useful in various applications including in display apparatuses and sensor arrays.

SUMMARY

In one aspect, the preset disclosure provides a stretchable display panel having a plurality of first regions and a plurality of second regions alternately arranged, comprising a plurality of first light emitting elements and a plurality of first driving circuits for driving light emission of the plurality of first light emitting elements; and a plurality of second light emitting elements and a plurality of second driving circuits for driving light emission of the plurality of second light emitting elements; wherein the plurality of first light emitting elements, the plurality of first driving circuits, and the plurality of second driving circuits are limited in the plurality of first regions; and the plurality of second light emitting elements are limited in the plurality of second regions; wherein the stretchable display panel in the plurality of first regions have a Young's modulus greater than a Young's modulus in the plurality of second regions of the stretchable display panel.

Optionally, the stretchable display panel is absent of any thin film transistor in the plurality of second regions.

Optionally, the plurality of first light emitting elements constitute a plurality of main pixels respectively in the plurality of first regions, each of the plurality of first regions having at least one of the plurality of main pixels; and the plurality of second light emitting elements constitute a plurality of auxiliary pixels respectively in the plurality of second regions, each of the plurality of second regions having at least one of the plurality of auxiliary pixels; wherein the stretchable display panel has a substantially non-stretched state and a stretched state; the plurality of main pixels are configured to be turned on for image display in both the substantially non-stretched state and the stretched state; and the plurality of auxiliary pixels are configured to be turned off in the substantially non-stretched state, and configured to be turned on for image display in the stretched state.

Optionally, the stretchable display panel further comprises a plurality of flexible signal lines respectively connecting the plurality of second light emitting elements and a plurality of second thin film transistors of the plurality of second driving circuits.

Optionally, the stretchable display panel comprises a stretchable base substrate; wherein the stretchable base substrate comprises a plurality of protrusions respectively in the plurality of first regions and a plurality of recesses respectively in the plurality of second regions, the plurality of protrusions and the plurality of recesses alternately arranged; and the stretchable base substrate in the plurality of first regions have a Young's modulus greater than a Young's modulus in the plurality of second regions of the stretchable base substrate.

Optionally, the stretchable display panel further comprises a first array substrate assembled together with the stretchable base substrate; wherein the first array substrate is attached to the plurality of protrusions of the stretchable base substrate respectively in the plurality of first regions; and portions of the first array substrate in the plurality of second regions are respectively movable relative to portions of the stretchable base substrate in the plurality of second regions respectively.

Optionally, the plurality of first light emitting elements a plurality of first thin film transistors of the plurality of first driving circuits, and a plurality of second thin film transistors of the plurality of second driving circuits are in the first array substrate and are limited in the plurality of first regions; the plurality of second light emitting elements are in the first array substrate and are limited in the plurality of second regions; and the first array substrate is absent of any thin film transistor in the plurality of second regions.

Optionally, the first array substrate comprises a first flexible base substrate extending throughout the first array substrate; a plurality of first thin film transistors of the plurality of first driving circuits and a plurality of second thin film transistors of the plurality of second driving circuits on the first flexible base substrate and limited in the plurality of first regions; a planarization layer on a side of the plurality of first thin film transistors and the plurality of second thin film transistors distal to the first flexible base substrate and limited in the plurality of first regions; the plurality of first light emitting elements on a side of the planarization layer distal to the first flexible base substrate and limited in the plurality of first regions; the plurality of second light emitting elements on the first flexible base substrate and limited in the plurality of second regions; and a plurality of flexible signal lines respectively connecting the plurality of second light emitting elements and the plurality of second thin film transistors; wherein at least the plurality of second light emitting elements are made of flexible materials.

Optionally, the stretchable display panel further comprises a second array substrate assembled together with the first array substrate and the stretchable base substrate; wherein the second array substrate is attached to the first array substrate respectively in the plurality of first regions; and portions of the second array substrate in the plurality of second regions are respectively movable relative to portions of the first array substrate in the plurality of second regions respectively.

Optionally, the plurality of first light emitting elements and a plurality of first thin film transistors of the plurality of first driving circuits are in the first array substrate and are limited in the plurality of first regions; the plurality of second light emitting elements are in the second array substrate and are limited in the plurality of second regions; a plurality of second thin film transistors of the plurality of second driving circuits are in the second array substrate and are limited in the plurality of first regions; and the first array substrate and the second array substrate are absent of any thin film transistor in the plurality of second regions.

Optionally, the first array substrate comprises a first flexible base substrate extending throughout the first array substrate; the plurality of first thin film transistors on the first flexible base substrate and limited in the plurality of first regions; a planarization layer on a side of the plurality of first thin film transistors distal to the first flexible base substrate and limited in the plurality of first regions; and the plurality of first light emitting elements on a side of the planarization layer distal to the first flexible base substrate and limited in the plurality of first regions; wherein the second array substrate comprises a second flexible base substrate extending throughout the second array substrate; the plurality of second thin film transistors on the second flexible base substrate and limited in the plurality of first regions; the plurality of second light emitting elements on the second flexible base substrate and limited in the plurality of second regions; and a plurality of flexible signal lines respectively connecting the plurality of second light emitting elements and the plurality of second thin film transistors; wherein at least the plurality of second light emitting elements are made of flexible materials.

Optionally, the plurality of second light emitting elements are in the first array substrate and are limited in the plurality of second regions; a plurality of second thin film transistors of the plurality of second driving circuits are in the first array substrate and are limited in the plurality of first regions; the plurality of first light emitting elements and a plurality of first thin film transistors of the plurality of first driving circuits are in the second array substrate and are limited in the plurality of first regions; and the first array substrate and the second array substrate are absent of any thin film transistor in the plurality of second regions.

Optionally, the first array substrate comprises a first flexible base substrate extending throughout the first array substrate; the plurality of second thin film transistors on the first flexible base substrate and limited in the plurality of first regions; the plurality of second light emitting elements on the first flexible base substrate and limited in the plurality of second regions; and a plurality of flexible signal lines respectively connecting the plurality of second light emitting elements and the plurality of second thin film transistors; wherein the second array substrate comprises a second flexible base substrate extending throughout the second array substrate; the plurality of first thin film transistors on the second flexible base substrate and limited in the plurality of first regions; a planarization layer on a side of the plurality of first thin film transistors distal to the second flexible base substrate and limited in the plurality of first regions and the plurality of first light emitting elements on a side of the planarization layer distal to the second flexible base substrate and limited in the plurality of first regions; wherein at least the plurality of second light emitting elements are made of flexible materials.

In another aspect, the present disclosure provides a stretchable display apparatus comprising the stretchable display panel described herein or fabricated by a method described herein.

In another aspect, the present disclosure provides method of image display in a stretchable display panel having a plurality of first regions and a plurality of second regions alternately arranged; wherein the stretchable display panel comprises a plurality of first light emitting elements and a plurality of first driving racers for driving light emission of the plurality of first light emitting elements; and a plurality of second light emitting elements and a plurality of second driving circuits for driving light emission of the plurality of second light emitting elements; wherein the plurality of first light emitting elements, the plurality of first driving circuits, and the plurality of second driving circuits are limited in the plurality of first regions; and the plurality of second light emitting elements are limited in the plurality of second regions; wherein the stretchable display panel in the plurality of first regions have a Young's modulus greater than a Young's modulus in the plurality of second regions of the stretchable display panel; wherein the method comprises displaying a first image in the stretchable display panel in a substantially non-stretched state; and displaying a second image in the stretchable display panel in a stretched state; wherein, in the substantially non-stretched state, the method includes turning on a plurality of main pixels including the plurality of first light emitting elements in the plurality of first regions; and turning off a plurality of auxiliary pixels including the plurality of second light emitting elements in the plurality of second regions; wherein, in the stretched state the method includes turning on the plurality of main pixels including the plurality of first light emitting elements in the plurality of first regions; and turning on the plurality of auxiliary pixels including the plurality of second light emitting elements in the plurality of second regions.

In another aspect, the present disclosure provides method of fabricating a stretchable display panel having a plurality of first regions and a plurality of second regions alternately arranged, comprising forming a plurality of first light emitting elements and a plurality of first driving circuits for driving light emission of the plurality of first light emitting elements; and forming a plurality of second light emitting elements and a plurality of second driving circuits for driving light emission of the plurality of second light emitting elements; wherein the plurality of first light emitting elements, the plurality of first driving circuits, and the plurality of second driving circuits are limited in the plurality of first regions; and the plurality of second light emitting elements are limited in the plurality of second regions; wherein the stretchable display panel in the plurality of first regions has a Young's modulus greater than a Young's modulus in the plurality of second regions of the stretchable display panel.

Optionally, the method comprises forming a stretchable base substrate on a first carrier substrate, the stretchable base substrate on the first carrier substrate is formed to be in a pre-stretched state, the stretchable base substrate is formed to have a plurality of protrusions respectively in the plurality of first regions and a plurality of recesses respectively in the plurality of second regions, the plurality of protrusions and the plurality of recesses alternately arranged; forming a first array substrate on a second carrier substrate; and assembling the first array substrate together with the stretchable base substrate in the pre-stretched state by attaching the first array substrate to the plurality of protrusions of the stretchable base substrate in the pre-stretched state respectively in the plurality of first regions; wherein the stretchable base substrate in the plurality of first regions is formed to have a Young's modulus greater than a Young's modulus in the plurality of second regions of the stretchable base substrate.

Optionally, forming the first array substrate comprises forming the plurality of first light emitting elements, a plurality of first thin film transistors of the plurality of first driving circuits, and a plurality of second thin film transistors of the plurality of second driving circuits in the first array substrate and limited in the plurality of first regions; and forming the plurality of second light emitting elements in the first array substrate and limited in the plurality of second regions; wherein the first array substrate is formed to be absent of any thin film transistor in the plurality of second regions.

Optionally, the method further comprises forming a second array substrate; and assembling the second array substrate together with the first array substrate and the stretchable base substrate in the pre-stretched state by attaching the second array substrate to the first array substrate respectively in the plurality of first regions; wherein the plurality of first light emitting elements and a plurality of first thin film transistors of the plurality of first driving circuits are formed in a first one of the first array substrate and the second array substrate and limited in the plurality of first regions; the plurality of second light emitting elements and a plurality of second thin film transistors of the plurality of second driving circuits are formed in a second one of the first array substrate and the second array substrate and, the second one different from the first one, the plurality of second light emitting elements formed to be limited in the plurality of second regions, and the plurality of second thin film transistors formed to be limited in the plurality of first regions; and the first array substrate and the second array substrate are formed to be absent of any thin film transistor in the plurality of second regions.

Optionally, forming the stretchable base substrate on a first carrier substrate comprises forming a sacrificial layer on the first carrier substrate and forming the stretchable base substrate in the pre-stretched state on a side of the sacrificial layer distal to the first carrier substrate; subsequent to assembling the first array substrate together with the stretchable base substrate in the pre-stretched state, the method further comprises removing the second carrier substrate from the first array substrate by a laser lift-off process; and removing the sacrificial layer to separate the stretchable base substrate from the first carrier substrate, thereby releasing the stretchable base substrate into a substantially non-stretched state.

BRIEF DESCRIPTION OF THE FIGURES

The following drawings are merely examples for illustrative purposes according to various disclosed embodiments and are not intended to limit the scope of the present invention.

FIG. 1B illustrate a stretchable display panel in a stretched state in some embodiments according to the present disclosure.

DETAILED DESCRIPTION

Figure 1A:
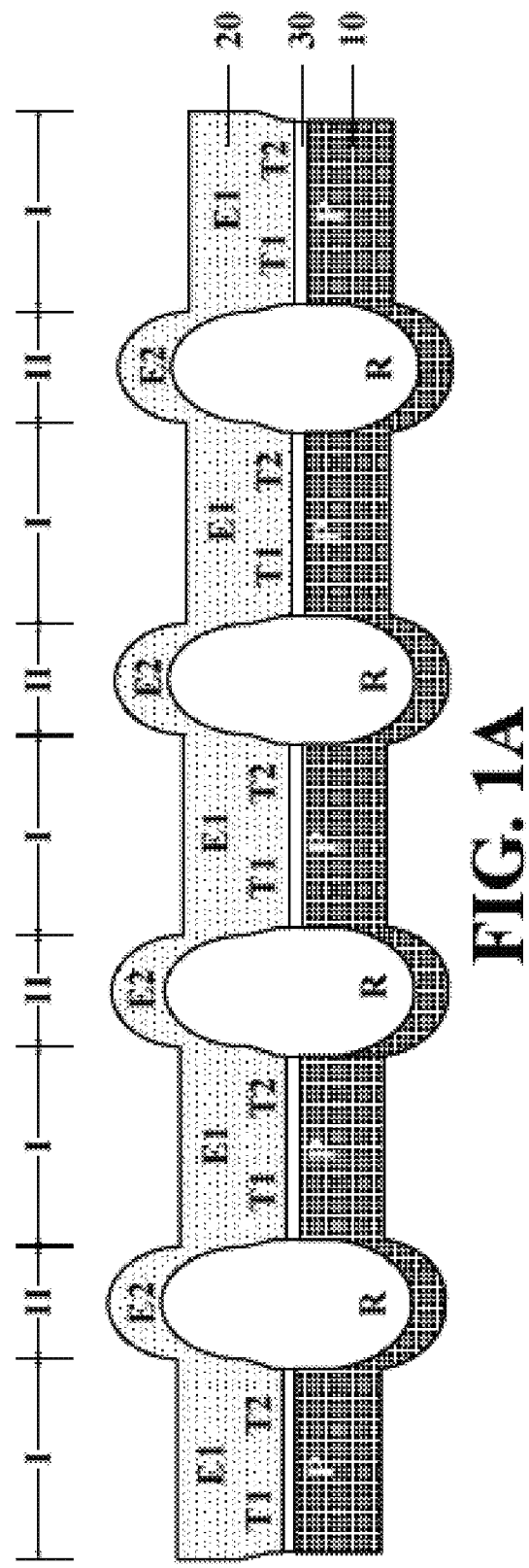
FIG. 1A illustrate a stretchable display panel in a substantially non-stretched state in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a stretchable display panel, a stretchable display apparatus, and a method of fabricating a stretchable display panel that substantially obviate one or more of the problems due to limitations and disadvantages of the related art. In one aspect, the present disclosure provides a stretchable display panel having a plurality of first regions and a plurality of second regions alternately arranged. Adjacent first regions of the plurality of first regions are spaced apart by a second region of the plurality of second regions; and adjacent second regions of the plurality of second regions are spaced apart by a first region of the plurality of first regions. In some embodiments, the stretchable display panel includes a plurality of first light emitting elements and a plurality of first driving circuits for driving light emission of the plurality of first light emitting elements; and a plurality of second light emitting elements and a plurality of second driving circuits for driving light emission of the plurality of second light emitting elements. Optionally, the plurality of first light emitting elements, the plurality of first driving circuits, and the plurality of second driving circuits are limited in the plurality of first regions. Optionally, the plurality of second light emitting elements are limited in the plurality of second regions. Optionally, the stretchable display panel in the plurality of first regions have a Young's modulus greater than a Young's modulus in the plurality of second regions of the stretchable display panel. For example, the plurality of second regions are more elastic or stretchable than the plurality of first regions.

As used herein, the term "stretchable" refers to the ability of a material, structure, device or device component to be strained in tension (e.g., being made longer and/or wider) without undergoing permanent deformation or failure such as fracture, e.g., the ability to elongate at least 10% of its length without permanently deforming, tearing, or breaking. The term is also meant to encompass substrates having components (whether or not the components themselves are individually stretchable as stated above) that are configured in such a way so as to accommodate a stretchable, inflatable, or expandable surface and remain functional when applied to a stretchable, inflatable, or otherwise expandable surface that is stretched, inflated, or otherwise expanded respectively. The term is also meant to encompass substrates that may be elastically and/or plastically deformable (i.e. after being stretched, the substrate may return to its original size when the stretching force is released or the substrate may not return to its original size and in some examples, may remain in the stretched form) and the deformation (i.e. stretching and optionally flexing) may occur during manufacture of the substrate (e.g. with the substrate being stretched and optionally flexed to form its final shape), during assembly of a device incorporating the substrate (which may be considered part of the manufacturing operation) and/or during use (e.g. with the user being able to stretch and optionally flex the substrate).

Optionally, a ratio of the Young's modulus of the stretchable display panel in the plurality of first regions to the Young's modulus of the stretchable display panel in the plurality of second regions is greater than 2, e.g., greater than 3, greater than 4, greater than 5, greater than 7.5, greater than 10, greater than 20, greater than 30, greater than 40, greater than 50, greater than 60, greater than 70, greater than 80, greater than 90, and greater than 100. Optionally, the stretchable display panel in the plurality of second regions has a Young's modulus in a range of approximately 0.001 GPa to approximately 0.5 GPa, e.g., approximately 0.001 GPa to approximately 0.05 GPa, approximately 0.05 GPa to approximately 0.1 GPa, approximately 0.1 GPa to approximately 0.2 GPa, approximately 0.2 GPa to approximately 0.3 GPa, approximately 0.3 GPa to approximately 0.4 GPa, and approximately 0.4 GPa to approximately 0.5 GPa. Optionally, the stretchable display panel in the plurality of second regions has a Young's modulus in a range of approximately 0.5 GPa to approximately 1.5 GPa, e.g., approximately 0.5 GPa to approximately 1.0 GPa and approximately 1.0 GPa to approximately 1.5 GPa. Optionally, the stretchable display panel in the plurality of first regions has a Young's modulus greater than 2.0 GPa, e.g., in a range of approximately 2.0 GPa to approximately 20 GPa, e.g., approximately 2.0 GPa to approximately 4.0 GPa, approximately 4.0 GPa to approximately 6.0 GPa, approximately 6.0 GPa to approximately 8.0 GPa, approximately 8.0 GPa to approximately 10 GPa, approximately 10 GPa to approximately 12.5 GPa, approximately 12.5 GPa to approximately 15 GPa, approximately 15 GPa to approximately 17.5 GPa, and approximately 17.5 GPa to approximately 20 GPa. Optionally, the stretchable display panel in the plurality of first regions has a Young's modulus greater than 20 GPa, e.g., greater than 40 GPa, greater than 60 GPa, greater than 80 GPa, greater than 100 GPa, greater than 150 GPa, greater than 200 GPa, greater than 300 GPa, greater than 400 GPa, greater than 500 GPa, greater than 600 GPa, greater than 700 GPa, greater than 800 GPa, greater than 900 GPa, and greater than 1000 GPa.

FIG. 1A illustrate a stretchable display panel in a substantially non-stretched state in some embodiments according to the present disclosure. FIG. 1B illustrate a stretchable display panel in a stretched state in some embodiments according to the present disclosure. As shown in FIG. 1A and FIG. 1B, the stretchable display panel having a plurality of first regions I and a plurality of second regions II alternately arranged. The stretchable display panel in the plurality of first regions I have a Young's modulus greater than a Young's modulus in the plurality of second legions II of the stretchable display panel, e.g., the stretchable display panel in the plurality of second regions II is more elastic or stretchable than the stretchable display panel in the plurality of first regions I.

Referring to FIG. 1A and FIG. 1B, the stretchable display panel in some embodiments includes a plurality of first light emitting elements E1 and a plurality of first driving circuits (including a plurality of first thin film transistors T1) for driving light emission of the plurality of first light emitting elements E1, and a plurality of second light emitting elements E2 and a plurality of second driving circuits (including a plurality of second thin film transistors T2) for driving light emission of the plurality of second light emitting elements E2. The plurality of first light emitting elements E1, the plurality of first driving circuits (including the plurality of first thin film transistors T1), and the plurality of second driving circuits (including the plurality of second thin film transistors T2) are limited in the plurality of first regions I. The plurality of second light emitting elements E2 are limited in the plurality of second regions II. As shown in FIG. 1A and FIG. 1B, in the stretched state, the plurality of second regions II are more stretchable, and the plurality of first regions I are more rigid.

In the stretched state, as shown in FIG. 1B, the plurality of second regions II are stretched to have a greater surface area. If the stretchable display panel is absent of any light emitting elements in the plurality of second regions II, the image display resolution of the stretchable display panel decreases in the stretched state. Thus, the plurality of second light emitting elements E2 can compensate for the decrease of image display resolution of the stretchable display panel. In one example, the present disclosure provides a driving method. The driving method includes displaying a first image in the stretchable display panel in a substantially non-stretched state; and displaying a second image in the stretchable display panel in a stretched state. In the substantially non-stretched state, the method includes turning on a plurality of main pixels including the plurality of first light emitting elements E1 in the plurality of first regions I, and turning off a plurality of auxiliary pixels including the plurality of second light emitting elements E2 in the plurality of second regions II. In the stretched state, the method includes turning on a plurality of main pixels including the plurality of first light emitting elements E1 in the plurality of first regions I, and turning on a plurality of auxiliary pixels including the plurality of second light emitting elements E2 in the plurality of second regions II. The image display resolutions in the substantially non-stretched state and the stretched state can be made approximately the same.

In the stretchable display panel according to the present disclosure, the stretchable display panel is absent of any thin film transistor in the plurality of second regions II. The thin film transistors are disposed exclusively in the plurality of first regions I, which are relatively more rigid regions of the stretchable display panel. The thin film transistors can be sufficiently protected from any damages caused by the stretching of the display panel. Also, the stretchable display panel in the plurality of second regions II can be made more flexible, enhancing the performance of the stretchable display panel.

In some embodiments, the stretchable display panel includes a stretchable base substrate 10 and one or more array substrates 20 assembled together. In one example, the stretchable base substrate 10 and the one or more array substrates 20 are assembled together by a first optical clear adhesive layer 30. Various other methods may be used for assembling the stretchable base substrate 10 and the one or more array substrates 20 together.

In some embodiments, and referring to FIG. 1A and FIG. 1B, the one or more array substrates 20 are attached to the stretchable base substrate 10 respectively in the plurality of first regions I. Portions of the one or more array substrates 20 in the plurality of second regions II are respectively movable relative to portions of the stretchable base substrate 10 in the plurality of second regions II respectively. Optionally, the stretchable base substrate 10 has a plurality of protrusions P respectively in the plurality of first regions I and a plurality of recesses R respectively in the plurality of second regions II. The stretchable base substrate 10 in the plurality of first regions I have a Young's modulus greater than a Young's modulus in the plurality of second regions II of the stretchable base substrate 10. Optionally, the one or more array substrates 20 are attached to the plurality of protrusions P of the stretchable base substrate 10 respectively in the plurality of first regions I. Portions or the one or more array substrates 20 in the plurality of second regions II correspond to the plurality of recesses R, and are allowed to be respectively movable relative to portions of the stretchable base substrate 10 corresponding to the plurality of recesses R in the plurality of second regions II respectively.

In some embodiments, the stretchable display panel in each individual one of the plurality of first regions I includes one or more pixels of the plurality of main pixels. Optionally, the stretchable display panel in each individual one of the plurality of first regions I includes a single one pixel of the plurality of main pixels. Optionally, the stretchable display panel in each individual one of the plurality of first regions I includes multiple pixels of the plurality of main pixels. Optionally, each of the plurality of main pixels includes one or more of the plurality of first light emitting elements E1. In one example, each of the plurality of main pixels includes a red light emitting element, a green light emitting element, and a blue light emitting element of the plurality of first light emitting elements E1.

In some embodiments, the stretchable display panel in each individual one of the plurality of second regions II includes one or more pixels of the plurality of auxiliary pixels. Optionally, the stretchable display panel in each individual one of the plurality of second regions II includes a single one pixel of the plurality of auxiliary pixels. Optionally, the stretchable display panel in each individual one of the plurality of second regions II includes multiple pixels of the plurality of auxiliary pixels. Optionally, each of the plurality of auxiliary pixels includes one or more of the plurality of second light emitting elements E2. In one example, each of the plurality of auxiliary pixels includes a red light emitting element, a green light emitting element, and a blue light emitting element of the plurality of second fight emitting elements E2.

Optionally, a ratio of a total number of the plurality of main pixels to a total number of the plurality of auxiliary pixels in the stretchable display panel is approximately 1:1. Optionally, a total number of main pixel(s) of the plurality of main pixels in each individual one of the plurality of first regions I is approximately the same as a total number of auxiliary pixel(s) of the plurality of auxiliary pixels in each individual one of the plurality of second regions II. Optionally, the stretchable display panel in each of the plurality of first regions I has at least one of the plurality of main pixels. Optionally, the stretchable display panel in each of the plurality of second regions II has at least one of the plurality of auxiliary pixels.

Figure 2A:
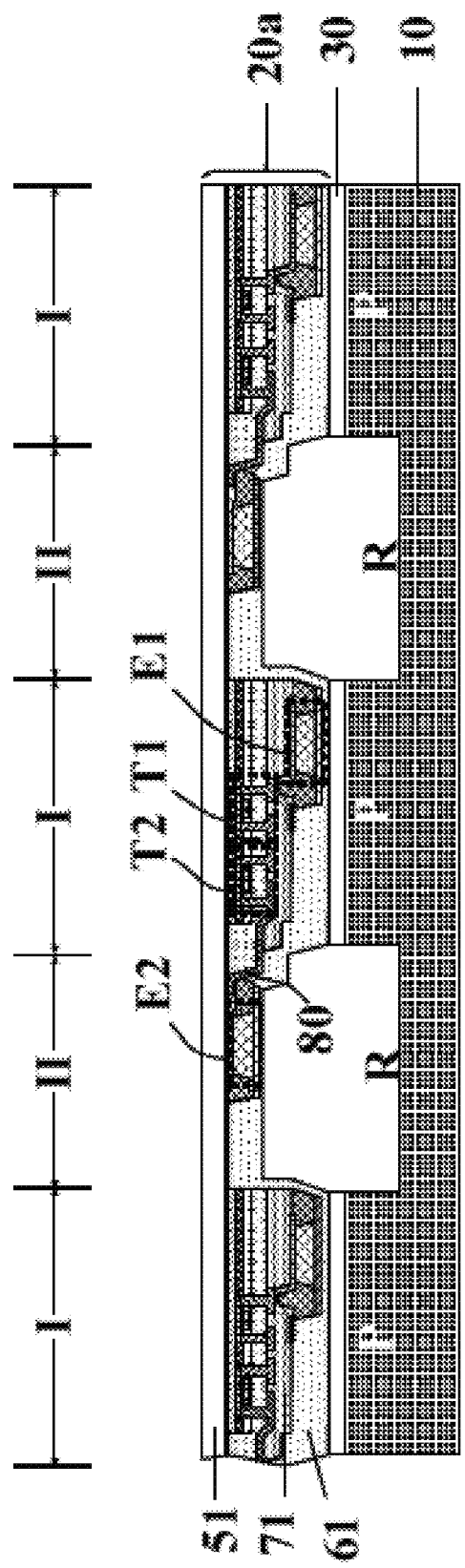
FIG. 2A is a schematic diagram illustrating the structure of a stretchable display panel in a stretched state in some embodiments according to the present disclosure.

FIG. 2A is a schematic diagram illustrating the structure of a stretchable display panel in a stretched state in some embodiments according to the present disclosure. Referring to FIG. 2A, the stretchable display panel in some embodiments includes a first array substrate 20a assembled together with a stretchable base substrate 10. The first array substrate 20a is attached to the plurality of protrusions P of the stretchable base substrate 10 respectively in the plurality of first regions I. The first array substrate 20a includes a plurality of first light emitting elements E1 and a plurality of first driving circuits (including a plurality of first thin film transistors T1) for driving light emission of the plurality of first light emitting elements E1, and a plurality of second light emitting elements E2 and a plurality of second driving circuits (including a plurality of second thin film transistors T2) for driving light emission of the plurality of second light emitting elements E2. The plurality of first light emitting elements E1, the plurality of first driving circuits (including the plurality of first thin film transistors T1), and the plurality of second driving circuits (including the plurality of second thin film transistors T2) are in the first array substrate 20a and limited in the plurality of first regions I. The plurality of second light emitting elements E2 are in the first array substrate 20a and limited in the plurality of second regions II. Portions of the first array substrate 20a in the plurality of second regions II are respectively movable relative to portions of the stretchable base substrate 10 in the plurality of second regions II respectively. Optionally, the first array substrate 20a is absent of any thin film transistor in the plurality of second regions II.

Referring to FIG. 2A, the first array substrate 20a in some embodiments includes a first flexible base substrate 51 extending throughout the first array substrate 20a, the plurality of first driving circuits (including the plurality of first thin film transistors T1) and the plurality of second driving circuits (including the plurality of second thin film transistors T2) on the first flexible base substrate 51 and limited in the plurality of first regions I, a first planarization layer 71 on a side of the plurality of first thin film transistors T1 and the plurality of second thin film transistors T2 distal to the first flexible base substrate 51 and limited in the plurality of first regions I, the plurality of first light emitting elements E1 on a side of the first planarization layer 71 distal to the first flexible base substrate 51 and limited in the plurality of first regions I, the plurality of second light emitting elements E2 on the first flexible base substrate 51 and limited in the plurality of second regions II, and a plurality of flexible signal lines 80 respectively connecting the plurality of second light emitting elements E2 and the plurality of second thin film transistors T2.

Optionally, drain electrodes of the plurality of second thin film transistors T2 are respectively connected to the plurality of second light emitting elements E2 respectively through the plurality of flexible signal lines 80. Optionally, the drain electrodes of the plurality of second thin film transistors T2 are made of flexible conductive materials. Optionally, the drain electrode of each individual one of the plurality of second thin film transistors T2 and a respective one of the plurality of flexible signal lines 80 constitute an integral structure, which is made of a flexible conductive material.

In some embodiments, the plurality of second light emitting elements E2 are made of flexible materials. For example, a light emitting layer, a cathode, and an anode of each of the plurality of second light emitting elements E2 are made of flexible materials. Because the plurality of second light emitting elements E2 are in the plurality of second regions (more stretchable regions) and are made of flexible materials, the stretchable display panel can be easily stretched (e.g., transitioning between a substantially non-stretch state and a stretched state) without causing any severe damages to the plurality of second light emitting elements E2.

Optionally, the plurality of first light emitting elements E1 are also made of flexible materials. For example, a light emitting layer, a cathode, and an anode of each of the plurality of first light emitting elements E1 are made of flexible materials. Accordingly, the plurality of first light emitting elements E1 and the plurality of second light emitting elements E2 can be fabricated in a same set of fabricating processes, further simplifying the manufacturing process of the stretchable display panel.

In some embodiments, the first array substrate 20a further includes a first encapsulating layer 61 on a side of the plurality of first light emitting elements E1 and the plurality of second light emitting elements E2 distal to the first flexible base substrate 51. The first encapsulating layer 61 encapsulates the plurality of first light emitting elements E1 and the plurality of second light emitting elements E2 from external environment, e.g., making the stretchable display panel oxygen resisted and moist resistant.

In some embodiments, the stretchable display panel further includes a first wheal clear adhesive layer 30 adhering the first array substrate 20a and the stretchable base substrate 10 together. Optionally, the first array substrate 20a is attached to the plurality of protrusions P of the stretchable base substrate 10 respectively in the plurality of first regions I. Optionally, the first encapsulating layer 61 of the first array substrate 20a is attached to the plurality of protrusions P of the stretchable base substrate 10 respectively in the plurality of first regions I, through the first optical clear adhesive layer 30. Portions of the first array substrate 20a in the plurality of second regions II correspond to the plurality of recesses R, and are allowed to be respectively movable relative to portions of the stretchable base substrate 10 corresponding to the plurality of recesses R in the plurality of second regions II respectively.

Figure 2B:
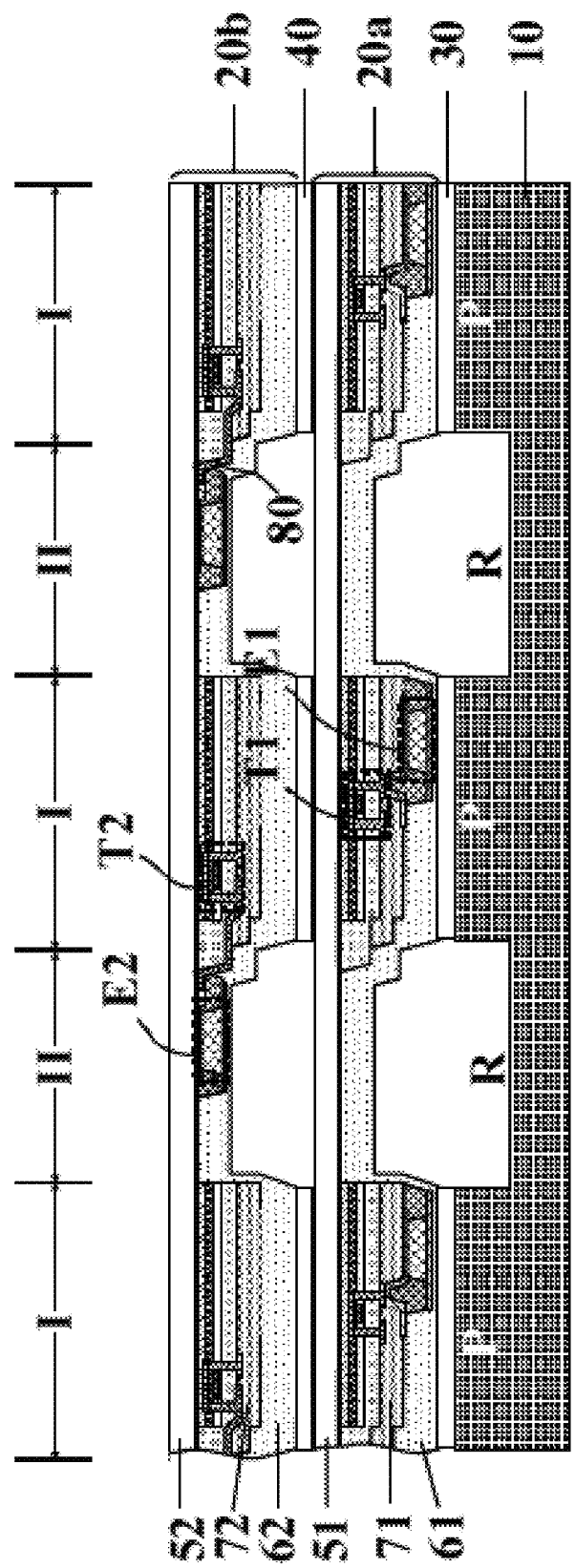
FIG. 2B is a schematic diagram illustrating the structure of a stretchable display panel in a stretched state in some embodiments according to the present disclosure.

FIG. 2B is a schematic diagram illustrating the structure of a stretchable display panel in a stretched state in some embodiments according to the present disclosure. Referring to FIG. 2B, the stretchable display panel in some embodiments includes a first array substrate 20a assembled together with a stretchable base substrate 10, and a second array substrate 20b assembled together with the first array substrate 20a and the stretchable base substrate 10. The first array substrate 20a is attached to the plurality of protrusions P of the stretchable base substrate 10 respectively in the plurality of first regions I, and the second array substrate 20b is attached to the first array substrate 20a respectively in the plurality of first regions I. The first array substrate 20a includes a plurality of first light emitting elements E1 and a plurality of first driving circuits (including a plurality of first thin film transistors T1) for driving light emission of the plurality of first light emitting elements E1. The second array substrate 20b includes a plurality of second light emitting elements E2 and a plurality of second driving circuits (including a plurality of second thin film transistors T2) for driving light emission of the plurality of second light emitting elements E2. The plurality of first light emitting elements E1 and the plurality of first driving circuits (including the plurality of first thin film transistors T1) are in the first array substrate 20a and limited in the plurality of first regions I. The plurality of second driving circuits (including the plurality of second thin film transistors T2) are in the second array substrate 20b and limited in the plurality of first regions I. The plurality of second light emitting elements E2 are in the second array substrate 20b and limited in the plurality of second regions II. Portions of the first array substrate 20a in the plurality of second regions II are respectively movable relative to portions of the stretchable base substrate 10 in the plurality of second regions II respectively. Positions of the second array substrate 20b in the plurality of second regions II are respectively movable relative to portions of the first array substrate 20a in the plurality of second regions II respectively. Optionally, the first array substrate 20a is absent of any thin film transistor in the plurality of second regions II. Optionally, the second array substrate 20b is absent of any thin film transistor in the plurality of second regions II.

Referring to FIG. 2B, the first array substrate 20a in some embodiments includes a first flexible base substrate 51 extending throughout the first array substrate 20a, the plurality of first thin film transistors T1 on the first flexible base substrate 51 and limited in the plurality of first regions I, a first planarization layer 71 on a side of the plurality of first thin film transistors T1 distal to the first flexible base substrate 51 and limited in the plurality of first regions I, and the plurality of first light emitting elements E1 an a side of the first planarization layer 71 distal to the first flexible base substrate 51 and limited in the plurality of first regions I.

Referring to FIG. 2B, the second array substrate 20b in some embodiments includes a second flexible base substrate 52 extending throughout the second array substrate 20b, the plurality of second thin film transistors T2 on the second flexible base substrate 52 and limited in the plurality of first regions I, a second planarization layer 72 on a side of the plurality of second thin film transistors T2 distal to the second flexible base substrate 52 and limited in the plurality of first regions I, the plurality of second light emitting elements E2 on the second flexible base substrate 52 and limited in the plurality of second regions II, and a plurality of flexible signal lines 80 respectively connecting the plurality of second light emitting element E2 and the plurality of second thin film transistors T2.

In some embodiment, the first array substrate 20a further includes a first encapsulating layer 61 on a side of the plurality of first light emitting elements E1 distal to the first flexible base substrate 51. The first encapsulating layer 61 encapsulates the plurality of first light emitting elements E1 from external environment, e.g., making the stretchable display panel oxygen resistant and moist resistant.

In some embodiments, the second array substrate 20b further includes a second encapsulating layer 62 on a side of the plurality of second light emitting elements E2 distal to the second flexible base substrate 52. The second encapsulating layer 62 encapsulates the plurality of second light emitting elements E2 from external environment, e.g., making the stretchable display panel oxygen resistant and moist resistant.

In some embodiments, the stretchable display panel further includes a first optical clear adhesive layer 30 adhering the first array substrate 20a and the stretchable base substrate 10 together, and a second optical clear alternative layer 40 adhering the first array substrate 20a and the second array substrate 20b together. Optionally, the first array substrate 20a is attached to the plurality of protrusions P of the stretchable base substrate 10 respectively in the plurality of first regions I, and the second array substrate 20b is attached to the first array substrate 20a respectively in the plurality of first regions I. Optionally, the first encapsulating layer 61 of the first array substrate 20a is attached to the plurality of protrusions P of the stretchable base substrate 10 respectively in the plurality of first regions I, through the first optical clear adhesive layer 30, and the second encapsulating layer 62 of the second array substrate 20b is attached to the first flexible base substrate 51 of the first array substrate 20a respectively in the plurality of first regions I. Portions of the first array substrate 20a and portions of the second array substrate 20b in the plurality of second regions II correspond to the plurality of recesses R, and are allowed to be respectively movable relative to portions of the stretchable base substrate 10 corresponding to the plurality of recesses R in the plurality of second regions II respectively.

Figure 2C:
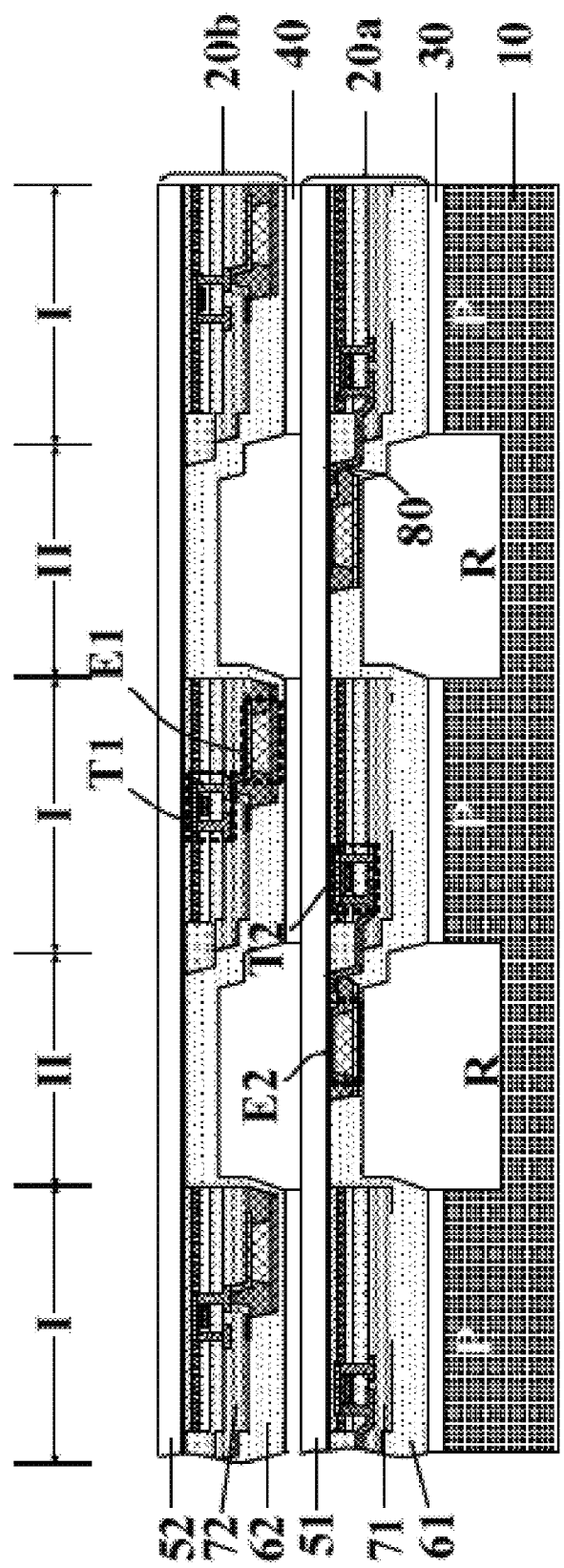
FIG. 2C is a schematic diagram illustrating the structure of a stretchable display panel in a stretched state in some embodiments according to the present disclosure.

FIG. 2C is a schematic diagram illustrating the structure of a stretchable display panel in a stretched state in some embodiments according to the present disclosure. Referring to FIG. 2C, the stretchable display panel in some embodiments includes a first array substrate 20a assembled together with a stretchable base substrate 10, and a second array substrate 20b assembled together with the first array substrate 20a and the stretchable base substrate 10. The first array substrate 20a is attached to the plurality of protrusions P of the stretchable base substrate 10 respectively in the plurality of first regions I, and the second array substrate 20b is attached to the first array substrate 20a respectively in the plurality of first regions I. The first array substrate 20a includes a plurality of second light emitting elements E2 and a plurality of second driving circuits (including a plurality of second thin film transistors T2) for driving light emission of the plurality of second light emitting emits E2. The second array substrate 20b includes a plurality of first light emitting elements E1 and a plurality of first driving circuits (including a plurality of first thin film transistors T1) for driving light emission of the plurality of first light emitting elements E1. The plurality of second driving circuits (including the plurality of second thin film transistors T2) are in the first array substrate 20a and limited in the plurality of first regions I. The plurality of second light emitting elements E2 are in the first array substrate 20a and limited in the plurality of second regions II. The plurality of first light emitting elements E1 and the plurality of first driving circuits (including the plurality of first thin film transistors T1) are in the second array substrate 20b and limited in the plurality of first regions I. Portions of the first array substrate 20a in the plurality of second regions II are respectively movable relative to portions of the stretchable base substrate 10 in the plurality of second regions II respectively. Portions of the second array substrate 20b in the plurality of second regions II are respectively movable relative to portions of the first array substrate 20a in the plurality of second regions II respectively. Optionally, the first array substrate 20a is absent of any thin film transistor in the plurality of second regions II. Optionally, the second array substrate 20b is absent of any thin film transistor in the plurality of second regions II.

Referring to FIG. 2C, the first array substrate 20a in some embodiments includes a first flexible base substrate 51 extending throughout the first array substrate 20a, the plurality of second thin film transistors T2 on the first flexible base substrate 51 and limited in the plurality of first regions I, a first planarization layer 71 on a side of the plurality of second thin film transistors T2 distal to the first flexible base substrate 51 and limited in the plurality of first regions I, the plurality of second light emitting elements E2 on the first flexible base substrate 51 and limited in the plurality of second regions II, and a plurality of flexible signal lines 80 respectively connecting the plurality of second light emitting elements E2 and the plurality of second thin film transistors T2.

Referring to FIG. 2C, the second array substrate 20b in some embodiments includes a second flexible base substrate 52 extending throughout the second array substrate 20b, the plurality of first thin film transistors T1 on the second flexible base substrate 52 and limited in the plurality of first regions I, a second planarization layer 72 on a side of the plurality of first thin film transistors T1 distal to the second flexible base substrate 52 and limited in the plurality of first regions I, and the plurality of first light emitting elements E1 on a side of the second planarization layer 72 distal to the second flexible base substrate 52 and limited in the plurality of first regions I.

In some embodiments, the first array substrate 20a further includes a first encapsulating layer 61 on a side of the plurality of second light emitting elements E2 distal to the first flexible base substrate 51. The first encapsulating layer 61 encapsulates the plurality of second light emitting elements E2 from external environment, e.g., making the stretchable display panel oxygen resistant and moist resistant.

In some embodiments, the second array substrate 20b further includes a second encapsulating layer 62 on a side of the plurality of first light emitting elements E1 distal to the second flexible base substrate 52. The second encapsulating layer 62 encapsulates the plurality of first light emitting elements E1 from external environment, e.g., making the stretchable display panel oxygen resistant and moist resistant.

In some embodiments, the stretchable display panel further includes a first optical clear adhesive layer 30 adhering the first array substrate 20a and the stretchable base substrate 10 together, and a second optical clear adhesive layer 40 adhering the first array substrate 20a and the second array substrate 20b together. Optionally, the first array substrate 20a is attached to the plurality of protrusions P of the stretchable base substrate 10 respectively in the plurality of first regions I, and the second array substrate 20b is attached to the first array substrate 20a respectively in the plurality of first regions I. Optionally, the first encapsulating layer 61 of the first array substrate 20a is attached to the plurality of protrusions P of the stretchable base substrate 10 respectively in the plurality of first regions I, through the first optical clear adhesive layer 30, and the second encapsulating layer 62 of the second array substrate 20b is attached to the first flexible base substrate 51 of the first array substrate 20a respectively in the plurality of first regions I. Portions of the first array substrate 20a and portions of the second array substrate 20b in the plurality of second regions II correspond to the plurality of recesses R, and are allowed to be respectively movable relative to portions of the stretchable base substrate 10 corresponding to the plurality of recesses R in the plurality of second regions II respectively.

Various appropriate elastomer polymer materials may be used for making the stretchable base substrata 10, the first flexible base substrate 51, and the second flexible base substrate 52. Examples of appropriate elastomer polymers include polyimides, polysilicones, polysiloxanes, polyepoxides, silicone-based polymers (e.g., polydimethylsiloxane-based materials such as polydimethylsiloxane, hexamethyldisiloxane, and polyphenylmethylsiloxane), polyurethane-based materials (such as polyurethane, polyurethane acrylate, polyether urethane, and polycarbonate-polyurethane elastomers), polyvinylfluoride, polyvinylchloride, acrylate polymer, acrylate terpolymer, rubbers (e.g., chloroprene rubber, acryl-based rubber, and nitrile rubber), polyvinylpyrolidone, polyvinyl alcohol, polymethyl methacrylate, cellulose acetate, cellulose acetate butyrate, cellulose acetate propionate, polymethyl acrylate, polyvinyl acetate, polyacrylonitrile, polyfurfuryl alcohol, polystyrene, polyethylene oxide, polypropylene oxide, polycarbonate, polyvinyl chloride, polycaprolactone, and any combination thereof.

Various appropriate flexible or stretchable conductive materials may be used for making the plurality of flexible signal lines 80, anodes and cathodes of the plurality of second light emitting elements E2, and optionally anodes and cathodes of the plurality of first list emitting elements E1. Examples of appropriate flexible or stretchable conductive materials for making the plurality of flexible signal lines 80, anodes and cathodes of the plurality of second light emitting elements E2, and anodes and cathodes of the plurality of first light emitting elements E1, include metals, alloys, graphene, carbon nanotubes, flexible conductive polymers, and other flexible conductive materials. For example, in some embodiments, the plurality of flexible signal lines 80, anodes and cathodes of the plurality of second light emitting elements E2, and anodes and cathodes of the plurality of first light emitting elements E1 are made of one or a combination of a liquid metal, carbon nanotubes, graphene, and silver nanowires.

In some embodiments, the first encapsulating layer 61 or the second encapsulating layer 62 includes one or more inorganic sub-layers and one or more organic flexible sub-layers. Various appropriate organic materials may be used for making the one or more organic flexible sub-layers. Examples of appropriate organic materials include polyimides, polysilicones, polysiloxanes, polyepoxides, silicone-based polymers (e.g., polydimethylsiloxane-based materials such as polydimethylsiloxane, hexamethyldisiloxane, and polyphenylmethylsiloxane), polyurethane-based materials (such as polyurethane, polyurethane acrylate, polyether urethane, and polycarbonate-polyurethane-elastomers), polyvinylfluoride, polyvinylchloride, acrylate polymer, acrylate terpolymer, rubbers (e.g., chloroprene rubber, acryl-based rubber, and nitrile rubber), polyvinylpyrrolidone, polyvinyl alcohol, polymethyl methacrylate, cellulose acetate, cellulose acetate butyrate, cellulose acetate propionate, polymethyl acrylate, polyvinyl acetate, polyacrylonitrile, polyfurfuryl alcohol, polystyrene, polyethylene oxide, polypropylene oxide, polycarbonate, polyvinyl chloride, polycaprolactone, and any combination thereof.

In some embodiments, each of the plurality of protrusions of the stretchable base substrate 10 has a width in a range of approximately 100 µm in approximately 400 µm, e.g., approximately 100 µm to approximately 200 µm, approximately 200 µm to approximately 300 µm, and approximately 300 µm to approximately 400 µm. In some embodiments, each of the plurality of recesses of the stretchable base substrate 10 has a width in a range of approximately 30 µm to approximately 200 µm, e.g., approximately 30 µm to approximately 50 µm, approximately 50 µm to approximately 100 µm, approximately 100 µm to approximately 150 µm, and approximately 150 µm to approximately 200 µm.

Figure 3A:
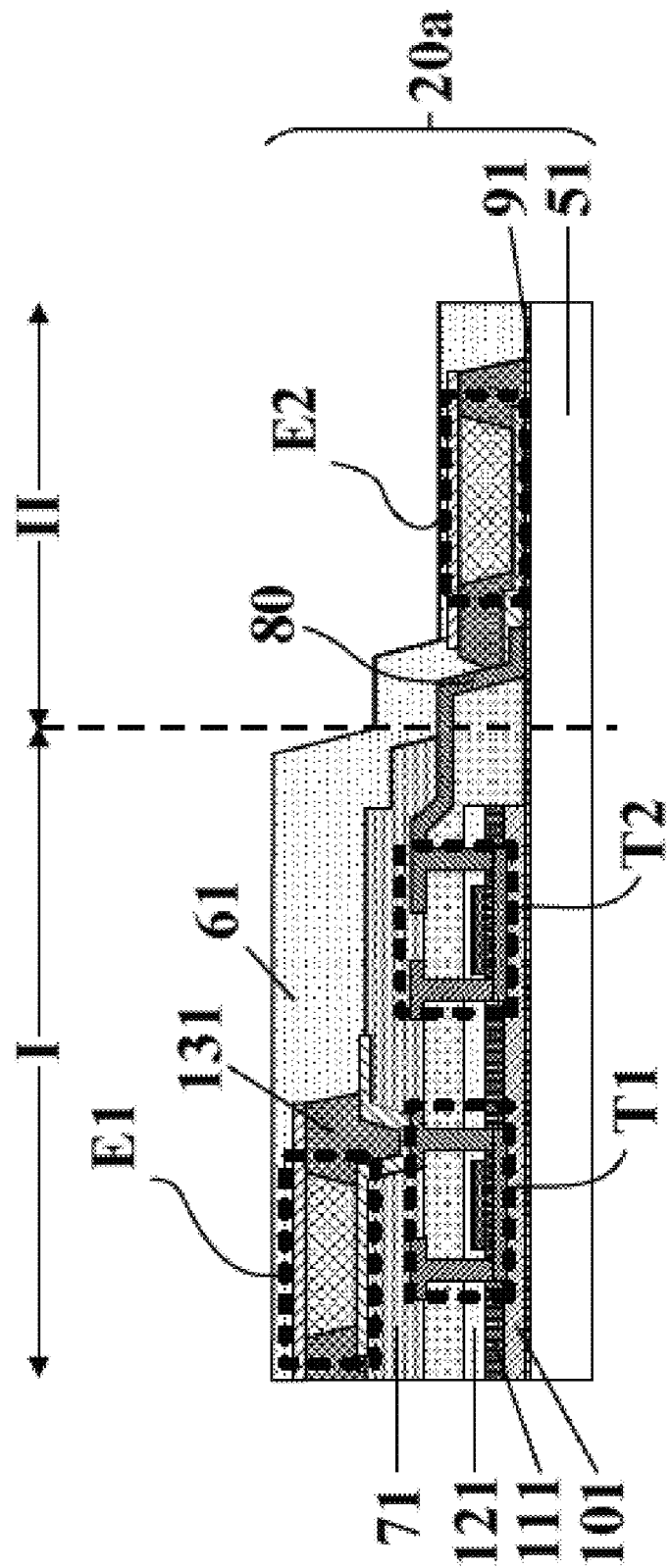
FIG. 3A is a schematic diagram of a first array substrate in the stretchable display panel of FIG. 2A.

FIG. 3A is a schematic diagram of a first array substrate in the stretchable display panel of FIG. 2A. Referring to FIG. 3A, in some embodiments, the first array substrate 20a further includes a first barrier layer 91 on the first flexible base substrate 51, a first buffer layer 101 on a side of the first barrier layer 91 distal to the first flexible base substrate 51, a first gate insulating layer 111 on a side of the first buffer layer 101 distal to the first barrier layer 91, and a first interlayer dielectric layer 121 on a side of the first gate insulating layer 111 distal to the first buffer layer 101. Optionally, the first barrier layer 91 extends throughout the first array substrate 20a. Optionally, each of the first buffer layer 101, the first gate insulating layer 111, the first interlayer dielectric layer 121, and the first planarization layer 71 is limited to the plurality of first regions I. Optionally, the first array substrate 20a further includes a first pixel definition layer 131 defining pixel apertures of the plurality of first light emitting elements E1 and the plurality of second light emitting elements E2.

Figure 3B:
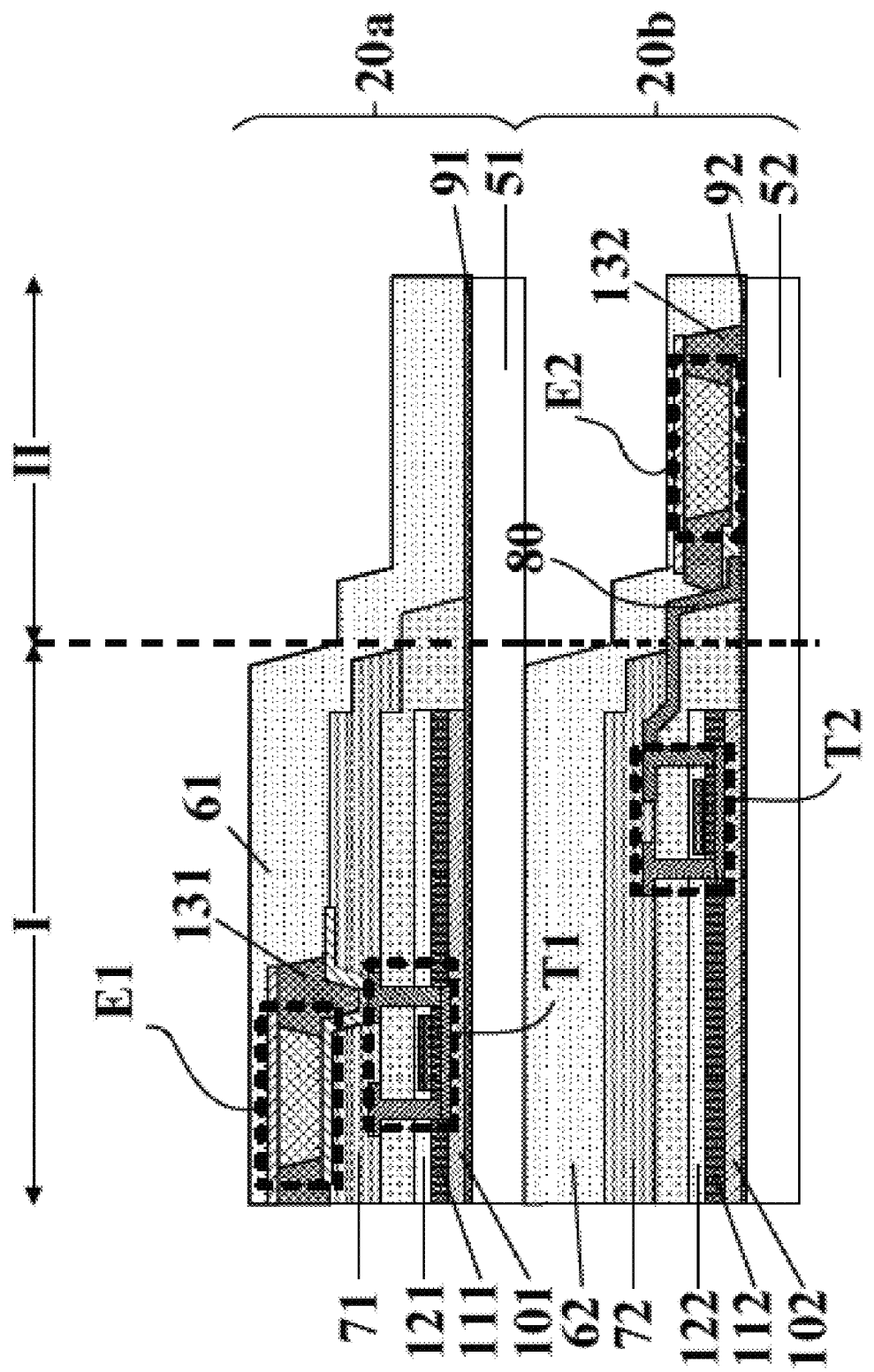
FIG. 3B is a schematic diagram of a first array substrate and a second array substrate in the stretchable display panel of FIG. 2B.

FIG. 3B is a schematic diagram of a first array substrate and a second array substrate in the stretchable display panel of FIG. 2B. Referring to FIG. 3B, in some embodiments, the first array substrate 20a further includes a first barrier layer 91 on the first flexible base substrate 51, a first buffer layer 101 on a side of the first barrier layer 91 distal to the first flexible base substrate 51, a first gate insulating layer 111 on a side of the first buffer layer 101 distal to the first barrier layer 91, and a first interlayer dielectric layer 121 on a side of the first gate insulating layer 111 distal to the first buffer layer 101. Optionally, the first barrier layer 91 extends throughout the first array substrate 20a. Optionally, each of the first buffer layer 101, the first gate insulating layer 111, the first interlayer dielectric layer 121, and the first planarization layer 71 is limited to the plurality of first regions I. Optionally, the first array substrate 20a further includes a first pixel definition layer 131 defining pixel apertures of the plurality of first light emitting elements E1. Referring to FIG. 3B, in some embodiments, the second array substrate 20b further includes a second barrier layer 92 on the second flexible base substrate 52, a second buffer layer 102 on a side of the second barrier layer 92 distal to the second flexible base substrate 52, a second gate insulating layer 112 on a side of the second buffer layer 102 distal to the second barrier layer 92, and a second interlayer dielectric layer 122 on a side of the second gate insulating layer 112 distal to the second buffer layer 102. Optionally, the second barrier layer 92 extends throughout the second gray substrate 20b. Optionally, each of the second buffer layer 102, the second gate insulating layer 112, the second interlayer dielectric layer 122, and the second planarization layer 72 is limited to the plurality of first regions I. Optionally, the second array substrate 20b further includes a second pixel definition layer 132 defining pixel apertures of the plurality of second light emitting elements E2.

Figure 3C:
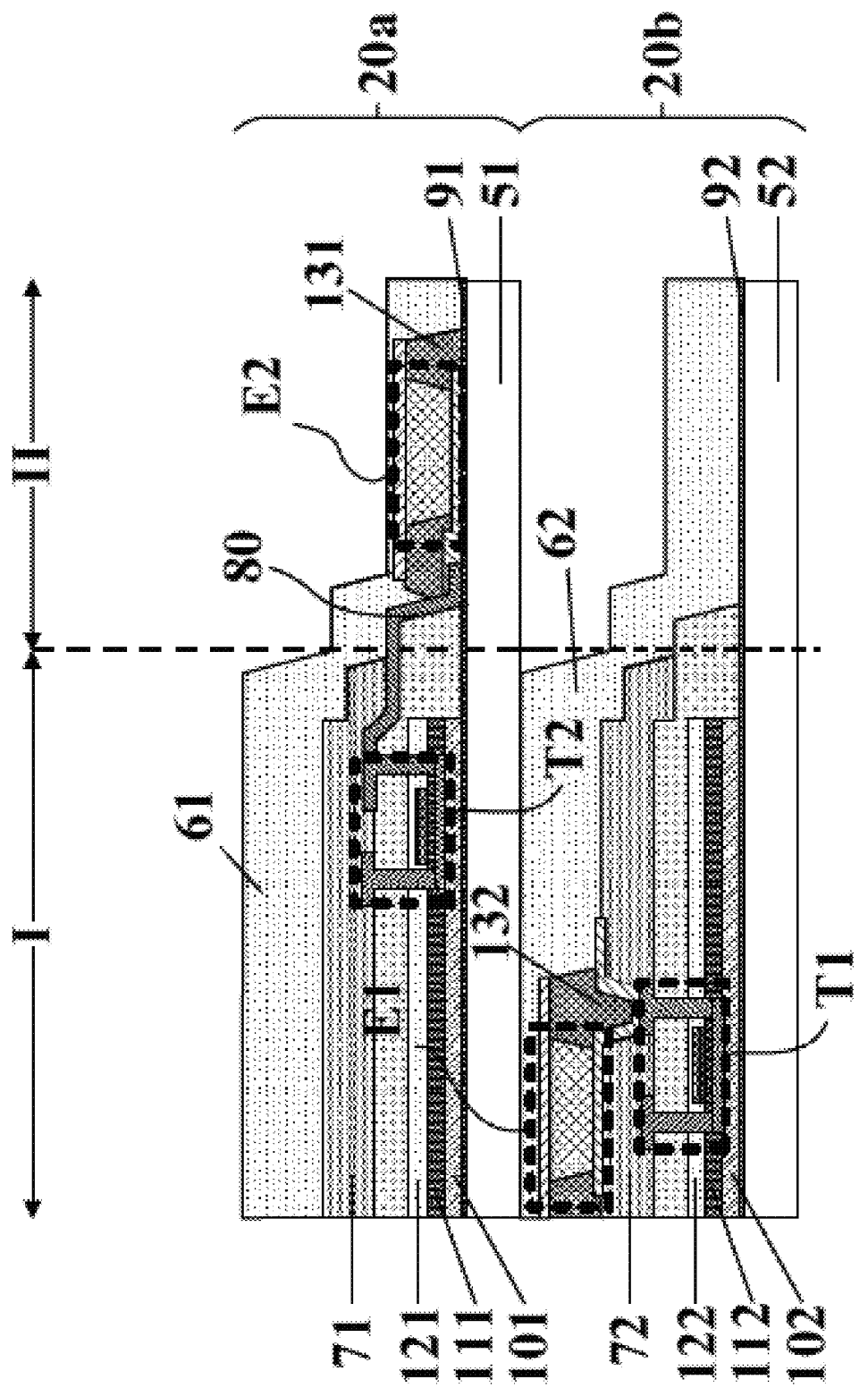
FIG. 3C is a schematic diagram of a first array substrate and a second array substrate in the stretchable display panel of FIG. 2C.

FIG. 3C is a schematic diagram of a first array substrate and a second array substrate in the stretchable display panel of FIG. 2C. Referring to FIG. 3C, in some embodiments, the first array substrate 20a further includes a first barrier layer 91 on the first flexible base substrate 51, a first buffer layer 101 on a side of the first barrier layer 91 distal to the first flexible base substrate 51, a first gate insulating layer 111 on a side of the first buffer layer 101 distal to the first barrier layer 91, and a first interlayer dielectric layer 121 on a side of the first gate insulating layer 111 distal to the first buffer layer 101. Optionally, the first barrier layer 91 extends throughout the first array substrate 20a. Optionally, each of the first buffer layer 101, the first gate insulating layer 111, the first interlayer dielectric layer 121, and the first planarization layer 71 is limited to the plurality of first regions I. Optionally, the first array substrate 20a further includes a first pixel definition layer 131 defining pixel apertures of the plurality of second light emitting elements E2. Referring to FIG. 3C, in some embodiments, the second array substrate 20b further includes a second barrier layer 92 on the second flexible base substrate 52, a second buffer layer 102 on a side of the second barrier layer 92 distal to the second flexible base substrate 52, a second gate insulating layer 112 on a side of the second buffer layer 102 distal to the second barrier layer 92, and a second interlayer dielectric layer 122 on a side of the second gate insulating layer 112 distal to the second buffer layer 102. Optionally, the second barrier layer 92 extends throughout the second array substrate 20b. Optionally, each of the second buffer layer 102, the second gate insulating layer 112, the second interlayer dielectric layer 122, and the second planarization layer 72 is limited to the plurality of first regions I. Optionally, the second array substrate 20b further includes a second pixel definition layer 132 defining pixel apertures of the plurality of first light emitting elements E1.

Various appropriate insulating materials and various appropriate fabricating methods may be used for making the first barrier layer 91 and the second barrier layer 92. For example, an insulating material may be deposited on the substrate by a plasma-enhanced chemical vapor deposition (PECVD) process and patterned. Examples of appropriate insulating materials for making the first barrier layer 91 and the second barrier layer 92 include, but are not limited to, silicon oxide ($SiO_x$), silicon nitride ($SiN_y$, e.g., $Si_3N_4$), silicon oxynitride ($SiO_xN_y$). Optionally, the first barrier layer 91 and the second barrier layer 92 are made of an inorganic material.

Various appropriate insulating materials and various appropriate fabricating methods may be used to make the first buffer layer 101, the second burr layer 102, the first gate insulating layer 111, the second gate insulating layer 112, the first interlayer dielectric layer 121, the second interlayer dielectric layer 122, the first planarization layer 71, the second planarization layer 72, the first pixel definition layer 131, the second pixel definition layer 132. For example, an insulating material may be deposited on the substrate by a plasma-enhanced chemical vapor deposition (PECVD) process and patterned. Examples of appropriate insulating materials for making the first buffer layer 101, the second buffer layer 102, the first gate insulating layer 111, the second gate insulating layer 112, the first interlayer dielectric layer 121, the second interlayer dielectric layer 122, the first planarization layer 71, the second planarization layer 72, the first pixel definition layer 131, the second pixel definition layer 132, include, but are not limited to, silicon oxide ($SiO_x$), silicon nitride ($SiN_y$, e.g., $Si_3N_4$), silicon oxynitride ($SiO_xN_y$), various resins, and various organic polymers.

Various appropriate light emitting elements may be used in the present stretchable display panel. Examples of appropriate light emitting elements include an organic light emitting diode, a quantum dots light emitting diode, and a micro light emitting diode.

In another aspect, the present disclosure provides a stretchable display apparatus including the stretchable display panel described herein or fabricated by a method described herein, and one or more driving circuits for driving image display in the stretchable display panel. Examples of appropriate stretchable display apparatuses include, but are not limited to, an electronic paper, a mobile phone, a tablet computer, a television, a monitor, a notebook computer, a digital album, a GPS, etc.

In another aspect, the present disclosure provides a method of fabricating a stretchable display panel having a plurality of first regions and a plurality of second regions alternately arranged. In some embodiments, the method includes forming a plurality of first light emitting elements and a plurality of first driving circuits (including a plurality of first thin film transistors) for driving light emission of the plurality of first light emitting elements; and forming a plurality of second light emitting elements and a plurality of second driving circuits (including a plurality of second thin film transistors) for driving light emission of the plurality of second light elements. Optionally, the plurality of first light emitting elements, the plurality of first driving circuits (including the plurality of first thin film transistors), and the plurality of second driving circuits (including the plurality of second thin film transistors) are formed to be limited in the plurality of first regions. Optionally, the plurality of second light emitting elements are formed to be limited in the plurality of second regions. Optionally, the stretchable display panel in the plurality of first regions is formed to have a Young's modulus greater than a Young's modulus in the plurality of second regions of the stretchable display panel. Optionally, the stretchable display panel is forced to be absent of any thin film transistor in the plurality of second regions.

In some embodiments, the method includes forming a stretchable base substrate on a first carrier substrate. The stretchable base substrate on the first carrier substrate is formed to be in a pre-stretched state, for example, the method in some embodiments includes pre-stretching a stretchable material layer to obtain a pre-stretched material layer, and attaching the pre-stretched material layer onto the first carrier substrate. Optionally, the stretchable base substrate is formed to have a plurality of protrusions respectively in the plurality of first regions and a plurality of recesses respectively in the plurality of second regions, the plurality of protrusions and the plurality of recesses alternately arranged. In one example, the stretchable material layer has the plurality of protrusions and the plurality of recesses pre-formed. In another example, the stretchable material layer does not have the plurality of protrusions and the plurality of recesses pre-formed, and the plurality of protrusions and the plurality of recesses are formed subsequent to attaching the pre-stretched material layer onto the first carrier substrate. Optionally, the stretchable base substrate in the plurality of first regions is formed to have a Young's modulus greater than a Young's modulus in the plurality of second regions of the stretchable base substrate.

In some embodiments, the method further includes forming a first array substrate on a second carrier substrate; and assembling the first array substrate together with the stretchable base substrate in the pre-stretched state by attaching the first array substrate to the plurality of protrusions of the stretchable base substrate in the pre-stretched state respectively in the plurality of first regions. The first array substrate and the stretchable base substrate are assembled together so that portions of the first array substrate in the plurality of second regions are respectively movable relative to portions of the stretchable base substrate in the plurality of second regions respectively.

In some embodiments, the step of forming the first array substrate includes forming the plurality of first light emitting elements, the plurality of first driving circuits (including the plurality of first thin film transistors), and the plurality of second driving circuits (including the plurality of second thin film transistors) in the first array substrate and limited in the plurality of first regions; and forming the plurality of second light emitting elements in the first array substrate and limited in the plurality of second regions. Optionally, the first array substrate is formed to be absent of any thin film transistor in the plurality of second regions.

In some embodiments, the step of forming the first array substrate includes forming a first flexible base substrate extending throughout the second carrier substrate; forming the plurality of first driving circuits (including the plurality of first thin film transistors) and the plurality of second driving circuits (including the plurality of second thin film transistors) on the first flexible base substrate and limited in the plurality of first regions; forming a planarization layer on a side of the plurality of first driving circuits and the plurality of second driving circuits distal to the first flexible base substrate and limited in the plurality of first regions; forming the plurality of first light emitting elements on a side of the planarization layer distal to the first flexible base substrate and limited in the plurality of first regions; forming the plurality of second light emitting elements on the first flexible base substrate and limited in the plurality of second regions; and forming a plurality of flexible signal lines respectively connecting the plurality of second light emitting elements and the plurality of second thin film transistors. Optionally, at least the plurality of second light emitting elements are made of finale materials.

In some embodiments, the method further includes forming a second array substrate; and assembling the second array substrate together with the first array substrate and the stretchable base substrate in the pre-stretched state by attaching the second array substrate to the first array substrate respectively in the plurality of first regions. The second array substrate and the first array substrate are assembled together so that portions of the second array substrate in the plurality of second regions are respectively movable relative to portions of the first array substrate in the plurality of second regions respectively.

In some embodiments, the step of forming the first array substrate includes forming the plurality of first light emitting elements and the plurality of first driving circuits (including the plurality of first thin film transistors) in the first array substrate and limited in the plurality of first regions; and the step of forming the second array substrate includes forming the plurality of second light emitting elements in the second array substrate and limited in the plurality of second regions; and forming the plurality of second driving circuits (including the plurality of second thin film transistors) in the second array substrate and limited in the plurality of first regions. Optionally, the first array substrate and the second array substrate are formed to be absent of any thin film transistor in the plurality of regions.

In some embodiments, the step of forming the first array substrate includes forming a first flexible base substrate extending throughout the second carrier substrate; forming the plurality of first driving circuits (including the plurality of first thin film transistors) on the first flexible base substrate and limited in the plurality of first regions; forming a planarization layer on a side of the plurality of first driving circuits distal to the first flexible base substrate and limited in the plurality of first regions; and forming the plurality of first light emitting elements on a side of the planarization layer distal to the first flexible base substrate and limited in the plurality of first regions. In some embodiments, the step of forming the second array substrate includes forming a second flexible base substrate extending throughout a third carrier substrate; forming the plurality of second driving circuits (including the plurality of second thin film transistors) on the second flexible base substrate and limited in the plurality of first regions; forming the plurality of second light emitting elements on the second flexible base substrate and limited in the plurality of second regions; and forming a plurality of flexible signal lines respectively connecting the plurality of second light emitting elements and the plurality of second thin film transistors. Optionally, at least the plurality of second light omitting elements are made of flexible materials.

In some embodiments, the step of forming the first array substrate includes forming the plurality of second light emitting elements in the first array substrate and limited in the plurality of second regions, and forming the plurality of second driving circuits (including the plurality of second thin film transistors) in the first array substrate and limited in the plurality of first regions; and the step of forming the second array substrate includes forming the plurality of first light emitting elements and the plurality of first driving circuits (including the plurality of first thin film transistors) in the second array substrate and limited in the plurality of first regions. Optionally, the first array substrate and the second array substrate are formed to be absent of any thin film transistor in the plurality of second regions.

In some embodiments, the step of forming the first array substrate includes forming a first flexible base substrate extending throughout the second carrier substrate; forming the plurality of second driving circuits (including the plurality of second thin film transistors) on the first flexible base substrate and limited in the plurality of first regions; forming the plurality of second light emitting elements on the first flexible base substrate and limited in the plurality of second regions; and forming a plurality of flexible signal lines respectively connecting the plurality of second light emitting elements and the plurality of second driving circuits (including the plurality of second thin film transistors). In some embodiments, the step of forming the second array substrate includes forming a second flexible base substrate extending throughout the second array substrate; forming the plurality of first driving circuits (including the plurality of first thin film transistors) on the second flexible base substrate and limited in the plurality of first regions; forming a planarization layer on a side of the plurality of first driving circuits distal to the second flexible base substrate and limited in the plurality of first regions; and forming the plurality of first light emitting elements on a side of the planarization layer distal to the second flexible base substrate and limited in the plurality of first regions. Optionally, at least the plurality of second light emitting elements are made of flexible materials.

In some embodiments, forming the stretchable base substrate on a first carrier substrate includes forming a sacrificial layer on the first carrier substrate and forming the stretchable base substrate in the pre-stretched state on a side of the sacrificial layer distal to the first carrier substrate. Subsequent to assembling the first array substrate together with the stretchable base substrate in the pre-stretched state, the method further includes removing the second carrier substrate from the first array substrate by a laser lift-off process; and removing the sacrificial layer to separate the stretchable base substrate from the first carrier substrate, thereby releasing the stretchable base substrate into a substantially non-stretched state.

Optionally, when the stretchable display panel is formed to include a second array substrate, the method further includes, subsequent to assembling the second array substrate together with the first array substrate, removing the third carrier substrate from the second array substrate by a laser lift-off process.

Various appropriate sacrificial materials may be used for making the sacrificial layer. Examples of appropriate sacrificial materials include water-soluble materials such as water-soluble polymers. Examples of water-soluble polymers include water-soluble polyacrylate and water-soluble polyurethane. Examples of appropriate sacrificial materials further includes various metal materials that can be etched by an etchant (e.g., a wet etchant). Examples of appropriate sacrificial materials further includes materials suitable for lift-off (e.g., laser lift-off), such as silicon oxide and silicon nitride.

Figure 4A:
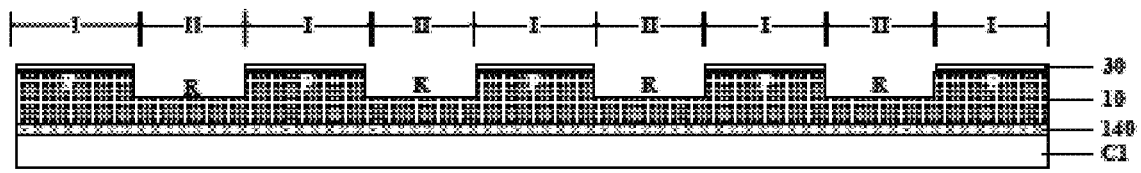
FIGS. 4A to 4E illustrate a process of fabricating a stretchable display panel in some embodiments according to the present disclosure.

FIGS. 4A to 4E illustrate a process of fabricating a stretchable display panel in some embodiments according to the present disclosure. Referring to FIG. 4A, a sacrificial layer 140 is formed on a first carrier substrate C1, and a stretchable base substrate 10 is formed on a side of the sacrificial layer 140 distal to the first carrier substrate C1. The stretchable base substrate 10 on the first carrier substrate is formed to be in a pre-stretched state. The stretchable base substrate 10 is formed to have a plurality of protrusions P respectively in the plurality of first regions I and a plurality of recesses R respectively in the plurality of second regions II. The plurality of protrusions P and the plurality of recesses R are alternately arranged. A first optical clear adhesive layer 30 is applied, e.g., on the plurality of protrusions P respectively is the plurality of first regions I.

Figure 4B:
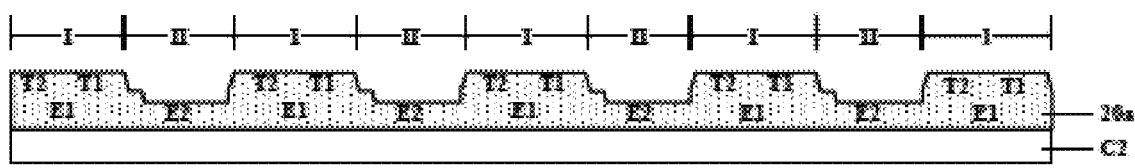

Referring to FIG. 4B, a first array substrate 20a is formed on a second carrier substrate C2. The first array substrate 20a is formed to include the plurality of first light emitting elements E1, the plurality of first driving circuits (including the plurality of first thin film transistors T1), and the plurality of second driving circuits (including the plurality of second thin film transistors T2), limited in the plurality of first regions I. The first array substrate 20a is formed to further include the plurality of second light emitting elements E2, limited in the plurality of second regions II.

Figure 4C:
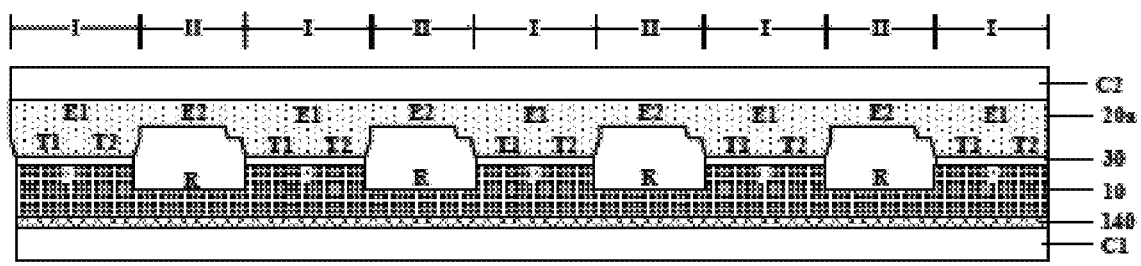

Referring to FIG. 4C, the first array substrate 20a and the stretchable base substrate 10 are assembled together, e.g., through the first optical clear adhesive layer 30. The first array substrate 20a is attached to the plurality of protrusions P of the stretchable base substrate 10 in the pre-stretched state respectively in the plurality of first regions I.

Figure 4D:
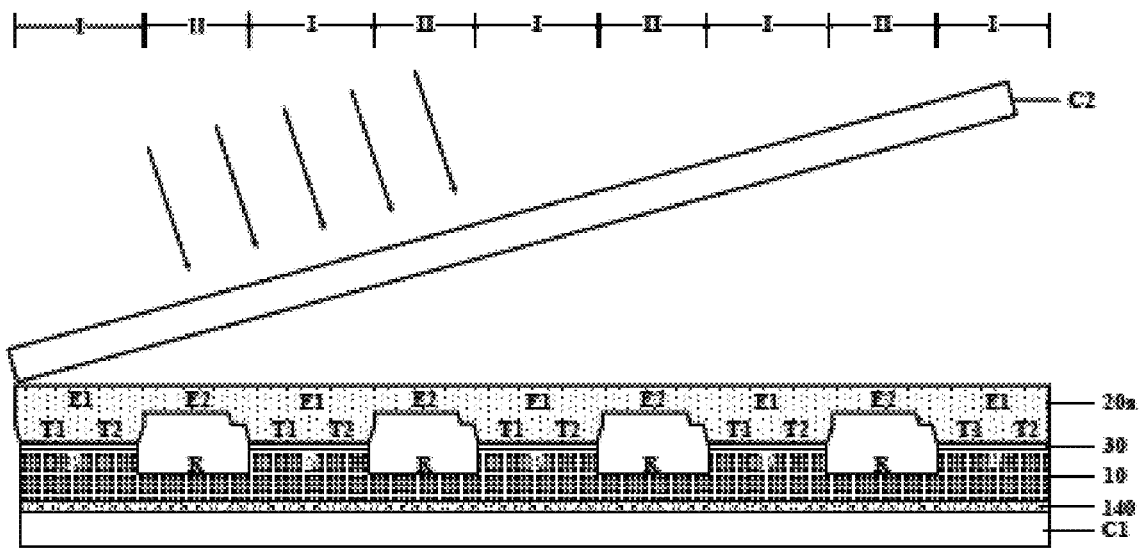

Referring to FIG. 4D, subsequent to assembling the first array substrate 20a and the stretchable base substrate 10 together, the second carrier substrate C2 is removed from the first array substrate 20a, e.g., by a laser lift-off process.

Figure 4E:
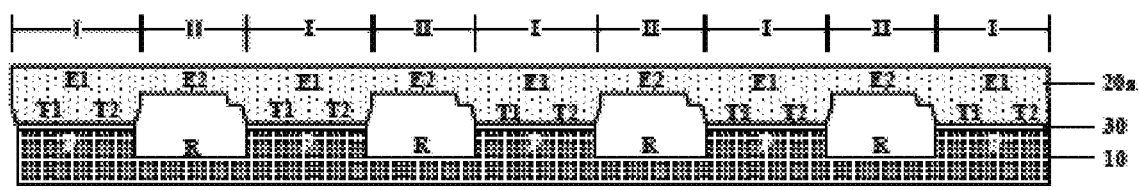

Referring to FIG. 4E, the first carrier substrate C1 is removed from the stretchable base substrate 10, e.g., by etching the sacrificial layer 140, thereby forming a stretchable display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with norm or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A stretchable display panel having a plurality of first regions and a plurality of second regions alternately arranged, comprising:
   a stretchable base substrate;
   a plurality of first light emitting elements and a plurality of first driving circuits for driving light emission of the plurality of first light emitting elements; and
   a plurality of second light emitting elements and a plurality of second driving circuits for driving light emission of the plurality of second light emitting elements;
   wherein the plurality of first light emitting elements, the plurality of first driving circuits, and the plurality of second driving circuits are limited in the plurality of first regions; and
   the plurality of second light emitting elements are limited in the plurality of second regions;
   wherein the stretchable base substrate comprises a plurality of protrusions respectively in the plurality of first regions and a plurality of recesses respectively in the plurality of second regions, the plurality of protrusions and the plurality of recesses alternately arranged;
   the stretchable display panel in the plurality of first regions have a Young's modulus greater than a Young's modulus in the plurality of second regions of the stretchable display panel; and
   the stretchable base substrate in the plurality of first regions have a Young's modulus greater than a Young's modulus in the plurality of second regions of the stretchable base substrate.

2. The stretchable display panel of claim 1, wherein the stretchable display panel is absent of any thin film transistor in the plurality of second regions.

3. The stretchable display panel of claim 1, wherein the plurality of first light emitting elements constitute a plurality of main pixels respectively in the plurality of first regions, each of the plurality of first regions having at least one of the plurality of main pixels; and
   the plurality of second light emitting elements constitute a plurality of auxiliary pixels respectively in the plurality of second regions, each of the plurality of second regions having at least one of the plurality of auxiliary pixels;
   wherein the stretchable display panel has a substantially non-stretched state and a stretched state;
   the plurality of main pixels are configured to be turned on for image display in both the substantially non-stretched state and the stretched state; and
   the plurality of auxiliary pixels are configured to be turned off in the substantially non-stretched state, and configured to be turned on for image display in the stretched state.

4. The stretchable display panel of claim 1, further comprising a plurality of flexible signal lines respectively connecting the plurality of second light emitting elements and a plurality of second thin film transistors of the plurality of second driving circuits.

5. The stretchable display panel of claim 1, wherein portions of the stretchable display panel covered by the plurality of first light emitting elements have a different structure than portions of the stretchable display panel covered by the plurality of second light emitting elements.

6. The stretchable display panel of claim 1, further comprising a first array substrate assembled together with the stretchable base substrate;

wherein the first array substrate is attached to the plurality of protrusions of the stretchable base substrate respectively in the plurality of first regions; and portions of the first array substrate in the plurality of second regions are respectively movable relative to portions of the stretchable base substrate in the plurality of second regions respectively.

7. The stretchable display panel of claim 6, wherein the plurality of first light emitting elements, a plurality of first thin film transistors of the plurality of first driving circuits, and a plurality of second thin film transistors of the plurality of second driving circuits are in the first array substrate and are limited in the plurality of first regions;

the plurality of second light emitting elements are in the first array substrate and are limited in the plurality of second regions; and the first array substrate is absent of any thin film transistor in the plurality of second regions.

8. The stretchable display panel of claim 6, wherein the first array substrate comprises:

a first flexible base substrate extending throughout the first array substrate;

a plurality of first thin film transistors of the plurality of first driving circuits and a plurality of second thin film transistors of the plurality of second driving circuits on the first flexible base substrate and limited in the plurality of first regions;

a planarization layer on a side of the plurality of first thin film transistors and the plurality of second thin film transistors distal to the first flexible base substrate and limited in the plurality of first regions;

the plurality of first light emitting elements on a side of the planarization layer distal to the first flexible base substrate and limited in the plurality of first regions;

the plurality of second light emitting elements on the first flexible base substrate and limited in the plurality of second regions; and a plurality of flexible signal lines respectively connecting the plurality of second light emitting elements and the plurality of second thin film transistors;

wherein at least the plurality of second light emitting elements are made of flexible materials.

9. The stretchable display panel of claim 6, further comprising a second array substrate assembled together with the first array substrate and the stretchable base substrate;

wherein the second array substrate is attached to the first array substrate respectively in the plurality of first regions; and portions of the second array substrate in the plurality of second regions are respectively movable relative to portions of the first array substrate in the plurality of second regions respectively.

10. The stretchable display panel of claim 9, wherein the plurality of first light emitting elements and a plurality of first thin film transistors of the plurality of first driving circuits are in the first array substrate and are limited in the plurality of first regions;

the plurality of second light emitting elements are in the second array substrate and are limited in the plurality of second regions;

a plurality of second thin film transistors of the plurality of second driving circuits are in the second array substrate and are limited in the plurality of first regions; and the first array substrate and the second array substrate are absent of any thin film transistor in the plurality of second regions.

11. The stretchable display panel of claim 10, wherein the first array substrate comprises:

a first flexible base substrate extending throughout the first array substrate;

the plurality of first thin film transistors on the first flexible base substrate and limited in the plurality of first regions;

a planarization layer on a side of the plurality of first thin film transistors distal to the first flexible base substrate and limited in the plurality of first regions; and the plurality of first light emitting elements on a side of the planarization layer distal to the first flexible base substrate and limited in the plurality of first regions;

wherein the second array substrate comprises:

a second flexible base substrate extending throughout the second array substrate;

the plurality of second thin film transistors on the second flexible base substrate and limited in the plurality of first regions;

the plurality of second light emitting elements on the second flexible base substrate and limited in the plurality of second regions; and a plurality of flexible signal lines respectively connecting the plurality of second light emitting elements and the plurality of second thin film transistors;

wherein at least the plurality of second light emitting elements are made of flexible materials.

12. The stretchable display panel of claim 9, wherein the plurality of second light emitting elements are in the first array substrate and are limited in the plurality of second regions;

a plurality of second thin film transistors of the plurality of second driving circuits are in the first array substrate and are limited in the plurality of first regions;

the plurality of first light emitting elements and a plurality of first thin film transistors of the plurality of first driving circuits are in the second array substrate and are limited in the plurality of first regions; and the first array substrate and the second array substrate are absent of any thin film transistor in the plurality of second regions.

13. The stretchable display panel of claim 12, wherein the first array substrate comprises:

a first flexible base substrate extending throughout the first array substrate;

the plurality of second thin film transistors on the first flexible base substrate and limited in the plurality of first regions;

the plurality of second light emitting elements on the first flexible base substrate and limited in the plurality of second regions; and a plurality of flexible signal lines respectively connecting the plurality of second light emitting elements and the plurality of second thin film transistors;

wherein the second array substrate comprises:

a second flexible base substrate extending throughout the second array substrate;

the plurality of first thin film transistors on the second flexible base substrate and limited in the plurality of first regions;

a planarization layer on a side of the plurality of first thin film transistors distal to the second flexible base substrate and limited in the plurality of first regions; and the plurality of first light emitting elements on a side of the planarization layer distal to the second flexible base substrate and limited in the plurality of first regions;

wherein at least the plurality of second light emitting elements are made of flexible materials.

14. A stretchable display apparatus, comprising the stretchable display panel of claim 1.

15. A method of image display in a stretchable display panel having a plurality of first regions and a plurality of second regions alternately arranged;
wherein the stretchable display panel comprises:
a stretchable base substrate;
a plurality of first light emitting elements and a plurality of first driving circuits for driving light emission of the plurality of first light emitting elements; and
a plurality of second light emitting elements and a plurality of second driving circuits for driving light emission of the plurality of second light emitting elements;
wherein the plurality of first light emitting elements, the plurality of first driving circuits, and the plurality of second driving circuits are limited in the plurality of first regions; and
the plurality of second light emitting elements are limited in the plurality of second regions;
wherein the stretchable base substrate comprises a plurality of protrusions respectively in the plurality of first regions and a plurality of recesses respectively in the plurality of second regions, the plurality of protrusions and the plurality of recesses alternately arranged;
the stretchable display panel in the plurality of first regions have a Young's modulus greater than a Young's modulus in the plurality of second regions of the stretchable display panel; and
the stretchable base substrate in the plurality of first regions have a Young's modulus greater than a Young's modulus in the plurality of second regions of the stretchable base substrate;
wherein the method comprises displaying a first image in the stretchable display panel in a substantially non-stretched state; and displaying a second image in the stretchable display panel in a stretched state;
wherein, in the substantially non-stretched state, the method includes turning on a plurality of main pixels including the plurality of first light emitting elements in the plurality of first regions; and turning off a plurality of auxiliary pixels including the plurality of second light emitting elements in the plurality of second regions;
wherein, in the stretched state, the method includes turning on the plurality of main pixels including the plurality of first light emitting elements in the plurality of first regions; and turning on the plurality of auxiliary pixels including the plurality of second light emitting elements in the plurality of second regions.

16. A method of fabricating a stretchable display panel having a plurality of first regions and a plurality of second regions alternately arranged, comprising:
forming a stretchable base substrate, the stretchable base substrate is formed to have a plurality of protrusions respectively in the plurality of first regions and a plurality of recesses respectively in the plurality of second regions, the plurality of protrusions and the plurality of recesses alternately arranged;
forming a plurality of first light emitting elements and a plurality of first driving circuits for driving light emission of the plurality of first light emitting elements; and
forming a plurality of second light emitting elements and a plurality of second driving circuits for driving light emission of the plurality of second light emitting elements;

wherein the plurality of first light emitting elements, the plurality of first driving circuits, and the plurality of second driving circuits are limited in the plurality of first regions; and
the plurality of second light emitting elements are limited in the plurality of second regions;
wherein the stretchable display panel in the plurality of first regions has a Young's modulus greater than a Young's modulus in the plurality of second regions of the stretchable display panel; and
the stretchable base substrate in the plurality of first regions is formed to have a Young's modulus greater than a Young's modulus in the plurality of second regions of the stretchable base substrate.

17. The method of claim 16,
wherein the stretchable base substrate is formed on a first carrier substrate, the stretchable base substrate on the first carrier substrate is formed to be in a pre-stretched state;
wherein the method further comprises:
forming a first array substrate on a second carrier substrate; and
assembling the first array substrate together with the stretchable base substrate in the pre-stretched state by attaching the first array substrate to the plurality of protrusions of the stretchable base substrate in the pre-stretched state respectively in the plurality of first regions.

18. The method of claim 17, wherein forming the first array substrate comprises:
forming the plurality of first light emitting elements, a plurality of first thin film transistors of the plurality of first driving circuits, and a plurality of second thin film transistors of the plurality of second driving circuits in the first array substrate and limited in the plurality of first regions; and
forming the plurality of second light emitting elements in the first array substrate and limited in the plurality of second regions;
wherein the first array substrate is formed to be absent of any thin film transistor in the plurality of second regions.

19. The method of claim 17, further comprising:
forming a second array substrate; and
assembling the second array substrate together with the first array substrate and the stretchable base substrate in the pre-stretched state by attaching the second array substrate to the first array substrate respectively in the plurality of first regions;
wherein the plurality of first light emitting elements and a plurality of first thin film transistors of the plurality of first driving circuits are formed in a first one of the first array substrate and the second array substrate and limited in the plurality of first regions;
the plurality of second light emitting elements and a plurality of second thin film transistors of the plurality of second driving circuits are formed in a second one of the first array substrate and the second array substrate and, the second one different from the first one, the plurality of second light emitting elements formed to be limited in the plurality of second regions, and the plurality of second thin film transistors formed to be limited in the plurality of first regions; and
the first array substrate and the second array substrate are formed to be absent of any thin film transistor in the plurality of second regions.

20. The method of claim 17, wherein forming the stretchable base substrate on a first carrier substrate comprises forming a sacrificial layer on the first carrier substrate and forming the stretchable base substrate in the pre-stretched state on a side of the sacrificial layer distal to the first carrier substrate;

subsequent to assembling the first array substrate together with the stretchable base substrate in the pre-stretched state, the method further comprising:

removing the second carrier substrate from the first array substrate by a laser lift-off process; and removing the sacrificial layer to separate the stretchable base substrate from the first carrier substrate, thereby releasing the stretchable base substrate into a substantially non-stretched state.

* * * * *